United States Patent [19]
Piccone et al.

[11] Patent Number: 6,032,845
[45] Date of Patent: Mar. 7, 2000

[54] VARIABLE PITCH TAPE FEEDER AND PITCH SELECTION SWITCH THEREFOR

[75] Inventors: John Piccone, Webster; Scott C. Proctor, Brockport; Patrick Leigh Simpson, Rochester, all of N.Y.

[73] Assignee: Hover-Davis, Inc., Spencerport, N.Y.

[21] Appl. No.: 09/173,590

[22] Filed: Oct. 15, 1998

[51] Int. Cl.⁷ .................................................. B65H 20/00
[52] U.S. Cl. ........................ 226/139; 226/128; 226/136; 198/832.1
[58] Field of Search .................................... 226/139, 128, 226/136, 43; 198/832.1

[56] References Cited

U.S. PATENT DOCUMENTS

| | | | |
|---|---|---|---|
| 4,887,778 | 12/1989 | Soth et al. | 226/139 X |
| 5,294,035 | 3/1994 | Asai et al. . | |
| 5,531,859 | 7/1996 | Lee et al. | 226/139 X |
| 5,588,614 | 12/1996 | Takada et al. | 226/139 X |
| 5,725,140 | 3/1998 | Weber et al. | 226/139 |
| 5,839,637 | 11/1998 | Kanai | 226/128 |

*Primary Examiner*—Donald P. Walsh
*Assistant Examiner*—Collin A. Webb
*Attorney, Agent, or Firm*—Leonard Heyman

[57] ABSTRACT

In a variable-pitch tape feeder for feeding parts to a pick and place machine used to produce electronic circuit boards, a switch assembly is provided which controls the limits of a shutter movement and the tape advance distance dependent upon the desired pitch. The tape feeder uses a carrier tape to deliver parts to the pick and place machine. The parts are inserted into depressions at regular intervals along the length of the tape. To accommodate tapes of varying pitches, i.e., distances between parts, the feeder uses an electronic control unit to drive the tape feed mechanism and actuate a shutter. The shutter prevents small parts from escaping their respective depressions prematurely. The switch provides a stop surface which limits the rearward travel of the shutter and a flag which is detected by optical sensors to determine the position of the switch and thus the pitch desired by the operator. By limiting the rearward travel of the shutter, especially when using small-pitch parts, parts subsequent to the one positioned at the pick-up point will be prevented from escaping their respective recesses in the carrier tape. A control unit electronically advances the carrier tape the desired distance according to the position of the switch.

19 Claims, 8 Drawing Sheets

VARIABLE PITCH TAPE FEEDER AND PITCH SELECTION SWITCH THEREFOR

BACKGROUND OF THE INVENTION

1. Field of the Invention

This invention relates to the manufacturing of circuit boards and electronic components, particularly to a tape feeder device for reliably conveying parts to a pickup location for attachment to a substrate using a pick and place machine. Carrier tapes used in tape feeders typically comprise a plastic strip having depressions at regular intervals containing the part to be mounted on the substrate and a second plastic cover strip covering the depressions to retain the parts in the depressions. This invention relates to a tape feeder device which can feed such carrier tapes in a variety of formats, including tapes of varying pitch, i.e., varying distances from one component to the next on the tape. Most particularly, this invention relates to a variable pitch tape feeder device which is reliable and easy to operate.

2. Description of the Related Art

The preferred method for the automated construction of circuit boards requires the use of high speed pick and place machines, which pick components from a pickup location and place them at required locations on the circuit board for attachment. Pick and place machines rely on feeding mechanisms to reliably feed the required parts to the expected pickup location. It has become common in the industry to package small electronic parts such as integrated circuit chips in carrier tape, which is characterized by a flexible strip of plastic with depressions formed at regular intervals along its length. A part is disposed in each depression and secured by a cover strip that is adhered along its edges to the carrier tape. Parts which are packaged in a carrier tape require the cover strip be peeled away from the carrier tape and that the carrier tape be advanced to bring the next part to the pickup location. Normally, the carrier tape is peeled back from the carrier tape at a point prior to the pick point as the tape is advanced.

Electronic parts are packaged in carrier tapes in a variety of formats, depending on the size of the part being delivered. In particular, carrier tapes are available in varying widths and pitches. The width is the distance from edge to edge perpendicular to the length of the tape. Widths common in the industry are 8 mm, 12 mm, 16 mm, 24 mm and up. The pitch is the distance from one depression to the next along the length of the tape. The present invention is directed to a tape feeder capable of delivering parts on 8 and 12 mm width tapes, though it can be easily modified to accommodate other sizes. The most popular pitches used by electronic parts manufacturers with 8 and 12 mm wide tapes are 2 mm, 4 mm, and 8 mm. On occasion, it is also necessary to use 12 mm pitch tape. Tapes are wound on reels and shipped to the manufacturing facility. It is obvious that the part manufacturer and user will desire to used the smallest pitch tape permissible for the size of the electronic component in order to reduce the length of the tape required, thereby reducing the size and/or number of reels for the required task.

For applications requiring high speed operation using low mass components, particularly those components with pitches of 8 mm or less, it is also important to provide means to keep each part from escaping its respective recess after the strip is removed but before it reaches the pick point. To this end, covers have been employed to cover the carrier tape past the point where the cover strip is peeled away up to the pick point.

An example is the fixed-pitch feeder shown in U.S. Pat. No. 4,327,482. Here, carrier tape T is supplied from supply reel 6. At the second roller 7, the cover strip 2 is removed and taken up by cover strip take-up reel 8. Immediately following the roller, cover 12 extends past the pick point, which is shown directly below suction head 14 at the location of a notch in the cover. This cover is not suitable for a variable pitch feeder for two reasons. First, for low mass parts, there is a risk that vibrations inherent in the advancing operation will knock the part from its recess when it reaches the pick point prior to being picked by the pick head. Second, in the case of a variable pitch feeder, the notch at the pick point must be large enough so that the largest-pitch part can pass through it, which makes it too large for smaller-pitch parts which remain exposed before they reach the pick point.

While tapes of varying widths can be easily accommodated by many feeders, providing a variable pitch feeder has proven troublesome in the industry. To accommodate carrier tapes of varying pitches, the amount of advance must be adjustable, and the size exposed area at the pickup location must be adjustable to prevent more than one part from being exposed at a time. To prevent a part from exiting its depression until it reaches the pickup location, shutter mechanisms are employed in a variety of ways.

Shutter mechanisms are used prevent a part from exiting its depression as it is being advanced to the pickup location by maintaining a cover over the depression until it reaches the pickup location. Once the part reaches the pickup location, the shutter withdraws, providing access to the exposed part so that the pick and place machine can remove it. In the case of variable pitch tape feeders, a special problem exists in that the travel distance of the shutter must vary in accordance with the pitch of the tape so that when one part reaches the pickup location, it is exposed, but the next part is not.

Several attempts have been made to provide a variable pitch tape feeder that can both vary the advance of the carrier tape and the travel distance of the shutter mechanism.

U.S. Pat. No. 5,725,140 to Weber et al. describes a variable pitch tape feeder having many of the features of the present invention. Most notably, the feeder includes adjustment means for varying the advance of the carrier tape to accommodate tapes of varying pitch as well as an adjustment for the travel distance of the shutter mechanism. Looking at FIG. 8D of this patent, to adjust the advance of the carrier tape, the user is required to rotate stop-block 130 to one of two positions and/or relocate ratchet arm 56 from pivot point 64 to pivot points S1 or S2. Additionally, to adjust the shutter-travel length, the user is required to rotate selector 139 to vary the location of pivot 97. The complicated mechanics of this device is necessary to transmit motion to all the functions of the feeder from a single actuator lever 46. While this device serves the purpose of reliably feeding carrier tapes of varying pitches, it is complicated to operate and timeconsuming to reconfigure.

U.S. Pat. No. 5,531,859 to Lee et al. and U.S. Pat. No. 5,294,035 to Asai et al. do not employ shutters, but enable selection of pitch advancement of a carrier tape by adjusting a pivot point in a manner similar to U.S. Pat. No. 5,725,140 above. For example, in U.S. Pat. No. 5,294,035,lever 74 is provided with a several pivot points 78, 88, and 89, each one of which provides for a different travel distance of plate 70 which ultimately drives feed pawl 60. Again, no shutter mechanism is provided and large rectangular opening 36 does not prevent exposed parts from escaping from their depressions due to ambient vibrations.

3. Summary of the Invention

To overcome the disadvantages of the prior art, the present invention provides a variable pitch feeder which uses an electronic control system with separate actuating mechanisms for advancing the carrier tape and the shutter mechanism. The operator is required to simply slide or rotate a selector switch to the setting which corresponds with the pitch of the carrier tape loaded in the device. In this manner, the switch serves the dual purpose of limiting rearward travel of the shutter mechanism as well as provide indication to the electronic control system of the required travel distance of the carrier tape for each advance operation. By limiting the rearward travel of the shutter mechanism, parts subsequent to the one positioned at the pick point will remain covered at all times and all the parts will be covered during the advancing operation.

In a preferred embodiment, the feeder can feed carrier tape having pitches of 2 mm, 4 mm, 8 mm, and 12 mm. The selector switch is located in an easily-accessed location behind the pickup location over the carrier tape and is actuated by sliding the switch forward or back. The switch comprises three major parts: The selector switch, a cover plate, and a shutter. The selector switch includes spring arms which engage notches in the stationary cover plate to provide 3 positive positions, each of which correlates with the pitch of the carrier tape being used. Alternatively, the selector switch includes notches which are engaged by spring arms of a stationary part. The selector switch also includes a stop surface which limits the rearward travel of the shutter and a pitch selector flag which provides, through the use of optical sensors, an indication to the electronic control unit of the desired pitch so that it will advance the carrier tape the proper distance during each advance operation. To operate at a fourth pitch, e.g., 12 mm, the entire selector assembly and shutter is removed.

In another embodiment, the selector switch is in the form of a knob which is rotated to one of four positions, each correlating to a pitch. The knob is located behind the pickup location and drives a cam to very the rearward travel limit of the shutter. In this embodiment, the knob position is advantageously sensed using magnetic Hall effect sensors to provide indication to the control unit as in the previous embodiment.

DETAILED DESCRIPTION OF THE PREFERRED EMBODIMENTS

Figure 1:
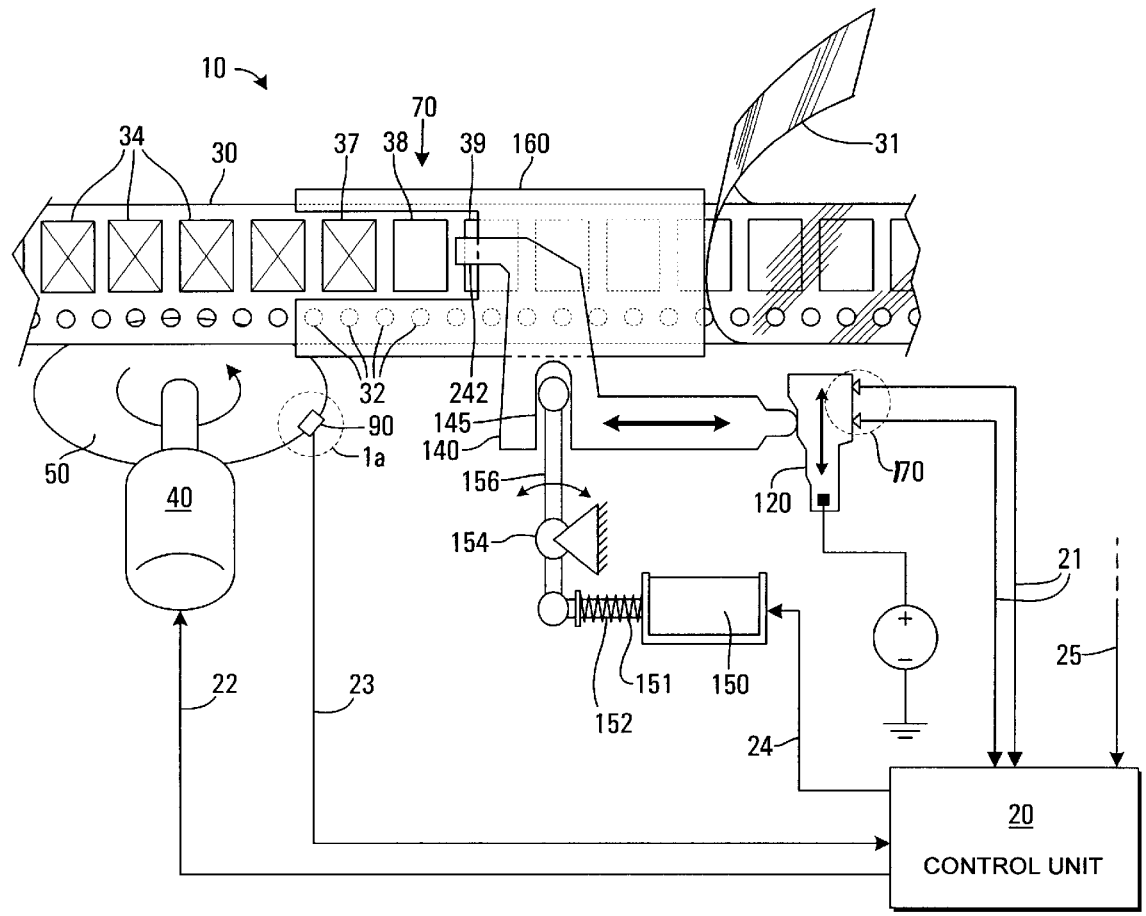
FIG. 1 is a schematic representation of the invention.
Figure 1A:
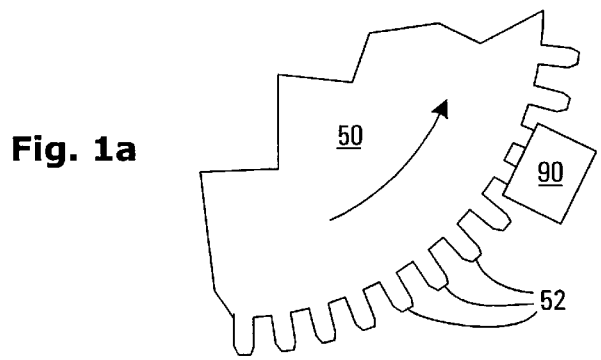
FIG. 1a is a close-up view of a sprocket and sprocket tooth sensor shown in FIG. 1.

The invention, indicated generally at 10, is laid out in the schematic view provided in FIG. 1. The purpose of the invention is to reliably and rapidly advance a carrier tape 30, which may be provided in one of a plurality of pitches and/or widths, to present parts disposed in recesses 34 in succession to pick-up point 70 without permitting the parts from escaping their respective recesses. The carrier tape is advanced to the left as seen in FIGS. 1, 3, 4, 7, 8, 10, 11a–11d, and 12. Empty recesses are represented in the schematic, and in FIGS. 11a and 11b, with an "X". As carrier tape is advanced, cover strip 31 is peeled away from the carrier tape 30, and from that point forward until pick-up location 70, the carrier tape is covered by cover 160 to prevent escape of any parts in recesses 34. Sprocket 50 is driven by electric motor 40 to advance carrier tape 30 by engaging feed holes 32 of carrier tape 30. To ensure that the drive motor accurately drives motor 40, a sensor 90, which can be an optical sensor, detects teeth 52 of sprocket 50 (see FIGS. 1a and 2) in the known manner.

Control unit 20 advances carrier tape 30 by driving motor 40 so that the carrier tape advances the distance from one recess 34 to the next in response to external signal 25 from a pick and place machine. Sensor 90 provides a feed-back signal 23 to control unit 20 for error correction. In addition, control unit 20 actuates solenoid 150 during each advance operation which causes rod 152 to retract into the solenoid unit against resistence provided by spring 151. When rod 152 retracts, lever 156 swings in a counter-clockwise direction as seen in FIGS. 1, 3, 4, 8, and 12 around stationary pivot 154. Lever 156 is interlocked with notch 145 so that when lever 156 rotates counter-clockwise, shutter 140 slides to the left, which extends shutter cover portion 242 over pick-up point 70. At the completion of the advance operation, control unit 20 deactivates solenoid 150 which causes lever 156 to rotate clockwise under influence of spring 152, returning shutter 140 to its retracted position as it comes to rest against switch 120.

In FIG. 1, switch 120 is represented as a cam surface which is movable in a direction perpendicular to the direction of travel of shutter 140. As switch 120 is moved to any of its 4 positions as seen in FIG. 1, the retracted position of shutter 140 is displaced. The purpose of this feature is important and more fully described below with reference to FIGS. 11a–11c. In addition, position sensor 170 provides an indication to control unit 20 of the position of switch 120 via signal 21.

FIG. 1 provides a simple manner of determining the position of switch 120: First a positive charge is applied to switch 120, then fixed contacts are positioned such that at each of four positions, a unique combination of voltages will be supplied via lines 21. In the position shown in FIG. 1, for example, a positive charge is provided via both lines. If switch 120 were to be moved down one notch, only the lower contact and its respective line 21 would have electricity. If switch 120 were to be moved up one notch, only the upper contact and its respective line would have a charge. Finally, if switch 120 were to be moved up two notches, neither of the contacts, and thus neither of lines 21 would have a charge. Although sensor 170 is shown in a crude way for illustration purposes, any method of providing a signal dependent upon the position of switch 120 could be employed.

Thus, sensor 170 provides control 20 with a signal 21 which corresponds to the position of switch 120. Control unit 20 operates to vary the distance of each advance of carrier tape 30 dependant upon the signal generated by sensor 170 which in turn depends on the position of switch 120. In other words, the position of switch 120 determines the distance of advance of carrier tape 30 and thus its pitch. In ordinary operation, the operator, having determined the pitch of the carrier tape in which the needed parts are packaged, would configure the feeder 10 to advance the tape the proper distance by appropriately positioning switch 120. In this way, switch 120 is appropriately characterized as a pitch switch.

Figure 2:
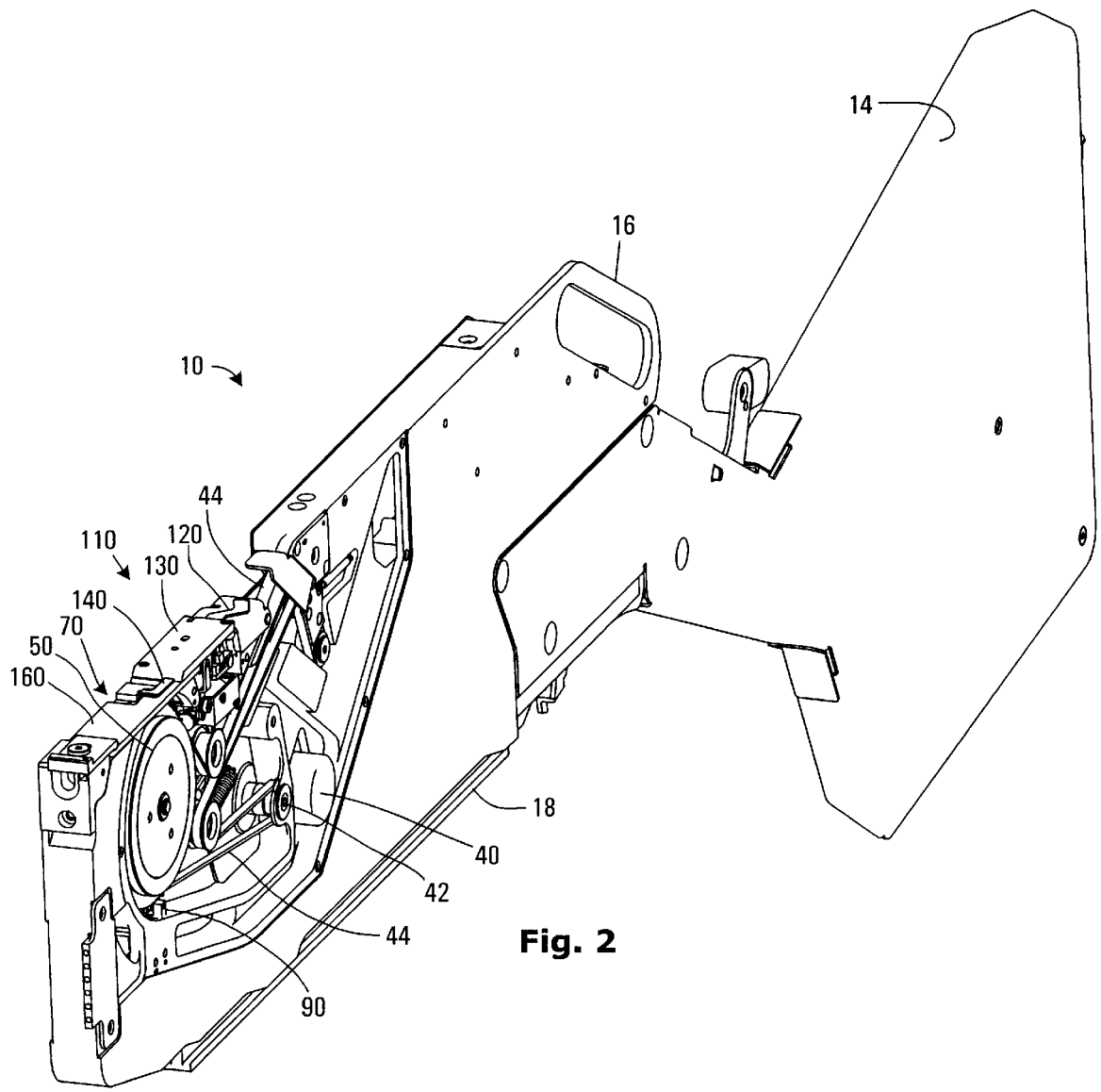
FIG. 2 shows an exemplary tape feeder employing invention.
Figure 3:
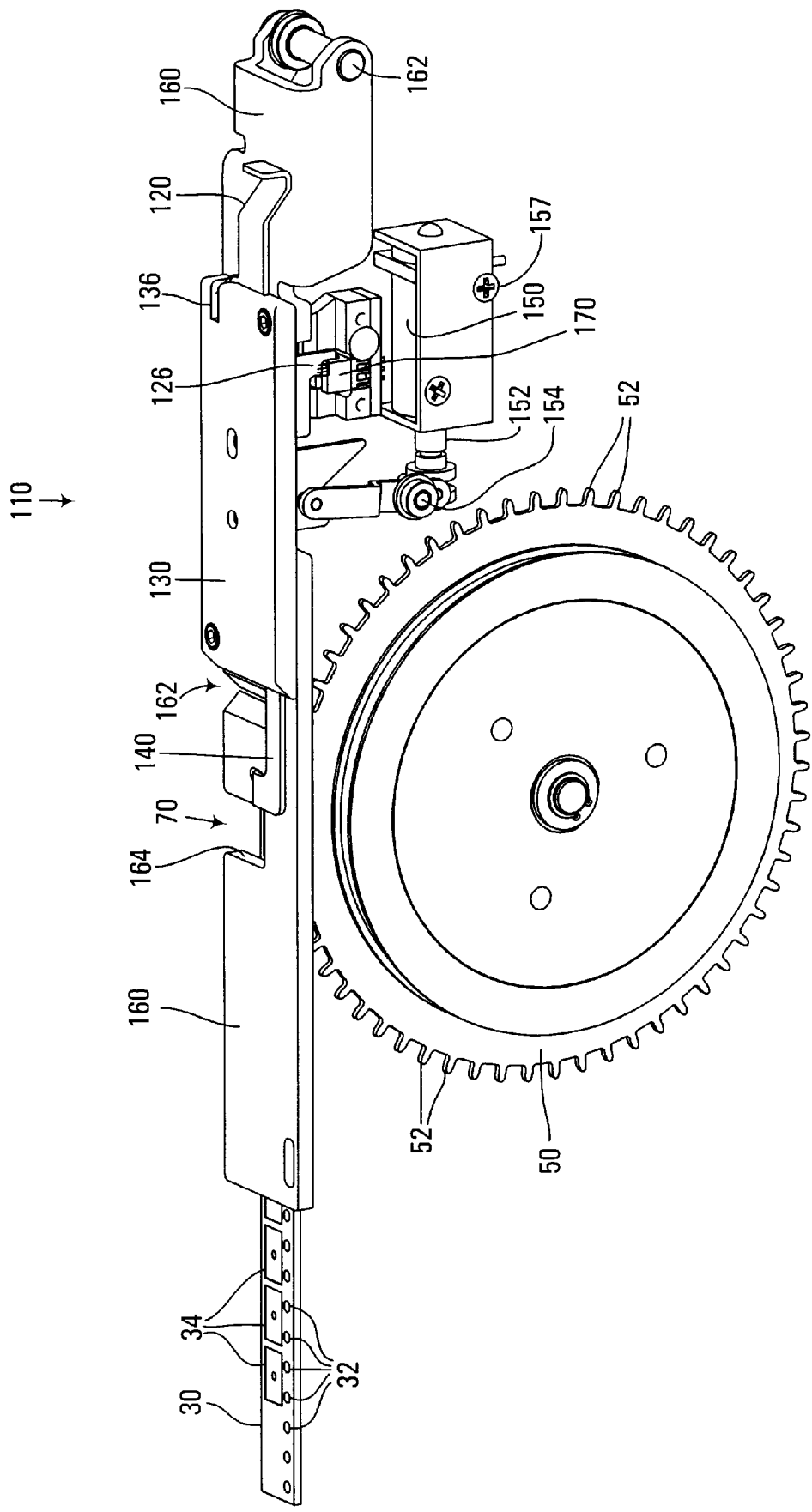
FIG. 3 shows the selector switch according to a first embodiment of the invention in combination with a drive sprocket for driving the carrier tape and the solenoid for driving the shutter mechanism.

Turning now to FIG. 2, a tape feeder 10 is shown including carrier tape spool support plate 14, handle 16 and support bar 18. Carrier tape 30 is provided with feed holes 32 as shown in FIGS. 1 and 3. Guides (not shown) formed into the back of the tape feeder direct carrier tape 30 from the spool (not shown) to a location above sprocket wheel 50 so that teeth 52 on sprocket wheel 50 engage feed holes 32. Additional guides (also not shown) guide the emptied carrier tape past the sprocket wheel curving down, then rearwardly to a disposal bin or take-up reel (not shown) in the known manner. Sprocket wheel 140 is driven by belt 44, which in turn, is driven by drive pulley 42 which is driven by motor 40. Drive motor 40 is electronically controlled by a control unit 20 which employs a feed-back loop using optical sensor 90 to detect teeth 52 of sprocket wheel 50 as described above with reference to FIG. 1. In this way, extremely accurate, reliable, and variable advance of carrier tape 30 is provided without complex mechanical linkages.

As carrier tape 30 passes opening 162 in cover plate 160, a cover strip 31 (see FIG. 1) is peeled away from carrier tape 30 and passes through opening 162 to a take-up reel or bin (not shown) in the known manner. Carrier tape 30 is advanced by sprocket wheel 50 to pickup location 70, where it is exposed for delivery to a pick and place machine.

Figure 4:
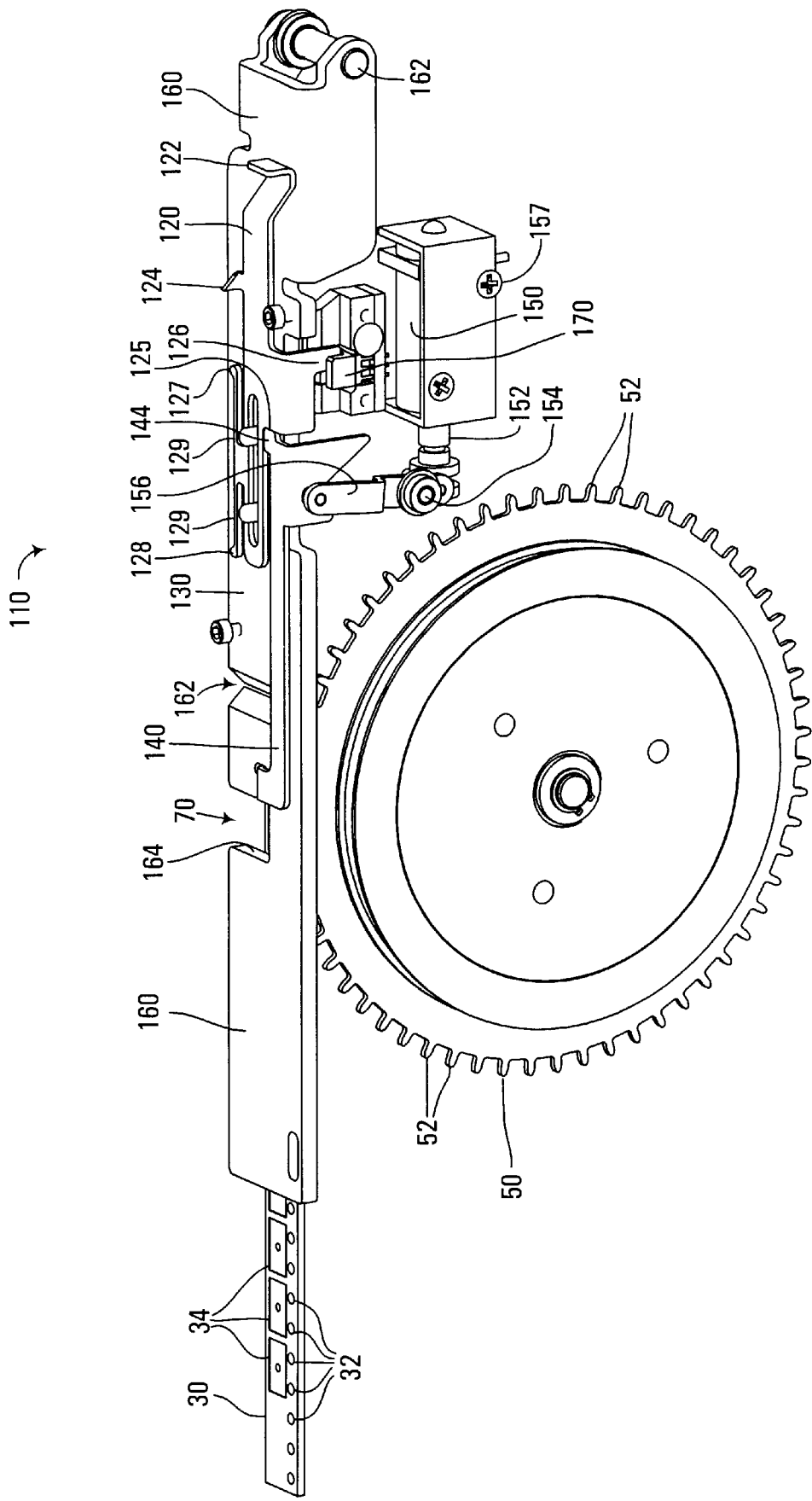
FIG. 4 shows the same elements as in FIG. 3 except the cover plate is removed from the selector switch mechanism.

Turning now FIGS. 3 and 4, the first embodiment of the invention will be discussed in detail. Selector switch assembly 110 includes carrier tape cover 160, shutter 140, selector switch 120, and cover plate 130, which will be discussed below with reference to FIGS. 4 and 5. Carrier tape cover 160 provides support for shutter 140, selector switch 120, and cover plate 130. Carrier tape cover 160 is removably attached to feeder 10 by hinge 162. The entire cover and shutter assembly is thus able to swing around hinge 162 for feeding the carrier tape through the feeder. A torsion spring 164 (shown in FIG. 7) is concentrically mounted over hinge 162 to maintain carrier tape cover 160 in its upright position. During normal operation, however, carrier tape cover 160 is maintained in the horizontal position shown. To hold the carrier tape cover 160 in a horizontal position, a latch mechanism 60, shown in FIGS. 8, 10, and 11a–11d, engage the end of cover 160. Latch tab 61, which is mounted to stationary block 65, is spring biased in the extended position to engage the end of cover 160. To release cover 160, ridge 63 can be actuated with a finger or thumb.

Carrier tape cover 160 includes slot 162 and access notch 164. Slot 162 is provided for peeling away cover strip 31 (see FIG. 1) which passes through slot 162 as it is peeled from carrier tape 30. Notch 164 is provided to permit access to a part contained in a recess 34 of carrier tape 30 by a pick and place machine. Notch 164 is partially occluded by shutter 140 during advance of tape 30. Shutter 140 is extended forward, which is to the left as seen in FIGS. 3 and 4, by lever 156, which is in turn actuated by solenoid 150. Solenoid 150 is mounted to a side panel (not shown) using screws 157, and operates in the manner discussed above with reference to FIG. 1.

Figure 5:
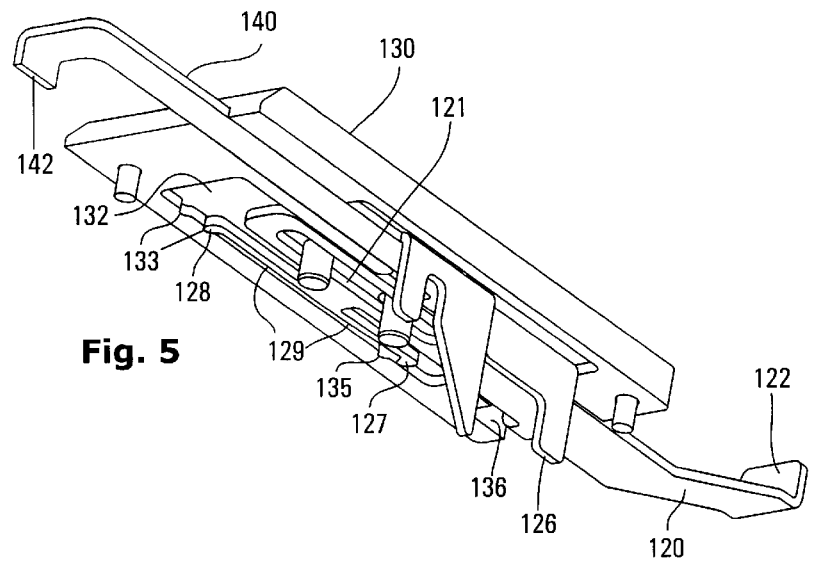
FIGS. 5 shows a perspective view of the selector switch mechanism looking up from beneath the mechanism.
Figure 6:
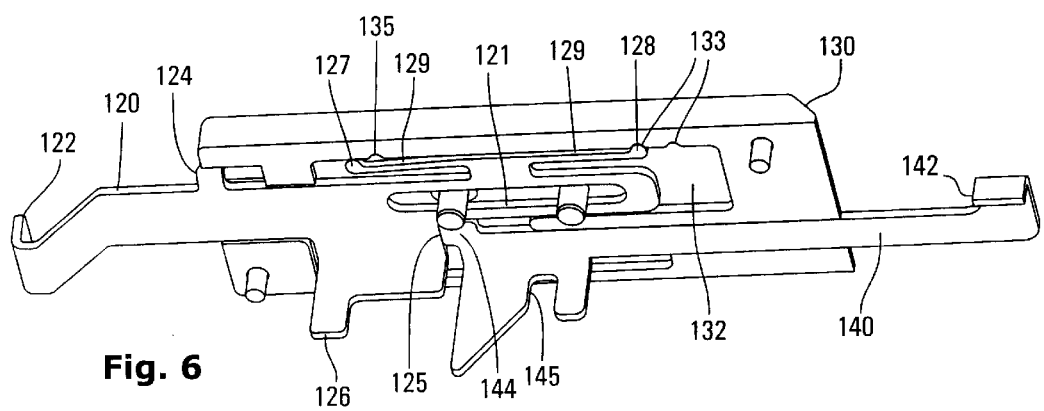
FIG. 6 shows the selector switch in a reverse view from that shown in FIG. 5.
Figure 7:
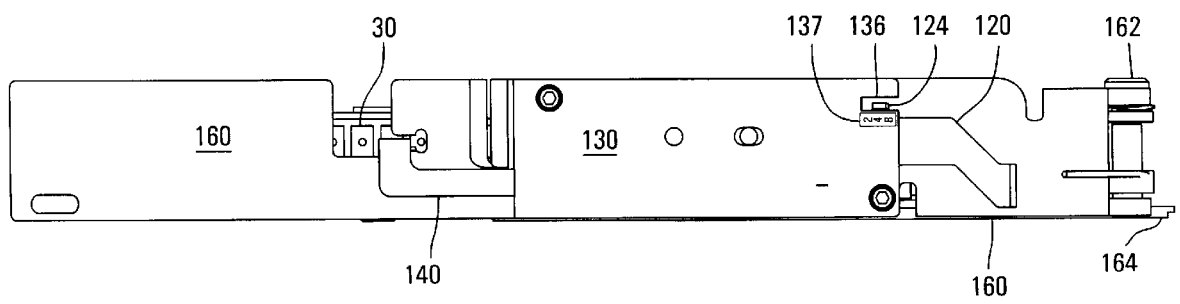
FIG. 7 shows a top view of the switch according to a first embodiment thereof.
Figure 8:
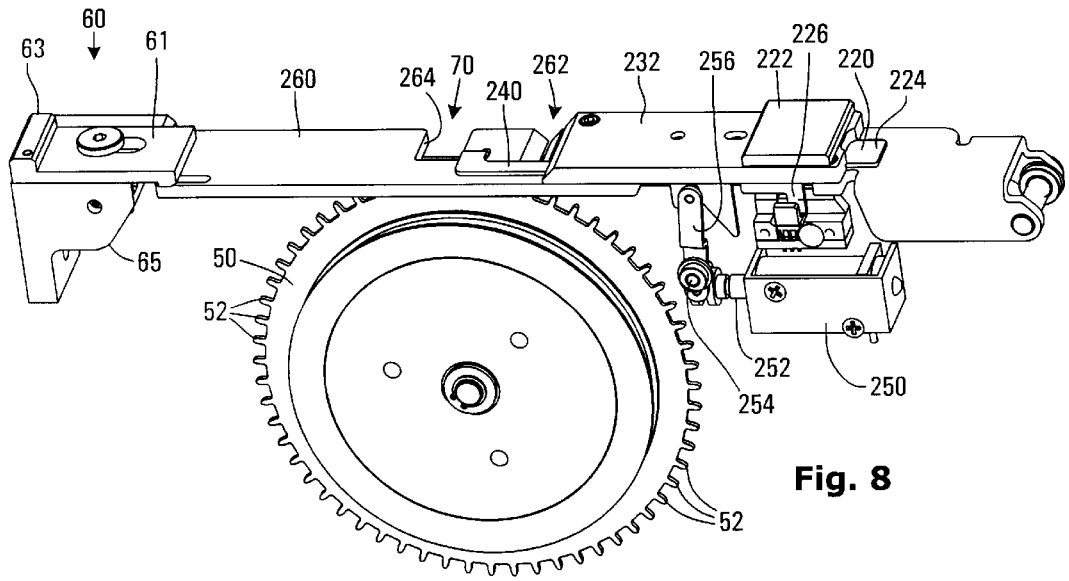
FIG. 8 shows the selector switch according to a second embodiment of the invention in combination with a drive sprocket for driving the carrier tape and the solenoid for driving the shutter mechanism.

The rearward travel of shutter 140 is limited by surface 125 of selector switch 120. When solenoid 150 releases rod 152, the rod returns to its extended position under the influence of the spring (not shown). Rotation of lever 156 and rearward movement of shutter 140 ceases when boss 144 comes into contact with surface 125 of selector switch 120. As seen in FIGS. 4 through 6, selector switch 120 includes spring arms 129 and spring arm bosses 127 and 128. Looking now to FIGS. 5 and 6, it can be seen that spring arm bosses 127 and 128 engage in depressions 133 and 135 formed in the side of recess 132 in the underside of cover plate 130. Three recesses are provided; two recesses 133 are engaged at the first and third position of the selector switch by spring arm bosses 128, and recess 135 is engaged at the second position of the selector switch by the second spring arm boss 127.

Depressions 133 and 135 in combination with spring arm bosses 127 and 128 provide tactile feedback to the operator when selecting a desired pitch, and prevent any inadvertent movement of selector switch 120 once a selection is made. The force exerted by boss 144 when it comes into contact with surface 125 is not sufficient to knock either spring arm boss from a depression 133 or 135 when it is engaged with that depression.

Turning back now to FIGS. 3 and 4, pitch selector flag 126 is formed into pitch selector switch 120. The flag extends vertically downward and its position is perceivable by optical sensor unit 170. Optical sensor unit 170 includes two optical emitters one optical sensor. The two emitters vary significantly in intensity which can be discriminated by the sensor. By detecting the intensity of the received signal, the control unit can determine which ones, if any, of the emitters are blocked by flag 126. This provides four possible combinations of detection: Either neither emitter is blocked, the first emitter is blocked, the second emitter is blocked, or both emitters are blocked. When neither emitter is blocked, the control unit (not shown) interprets this to mean that the pitch selector flag 126 is not present, which will mean that the carrier tape cover 160 and thus shutter assembly 110 are not attached or in the horizontal position. The control unit will interpret this to mean that a pitch of 12 mm is desired. At this pitch, no shutter is necessary, and the cover assembly is removed and replaced by a cover assembly having a 12 mm notch and no shutter mechanism.

When only the right-most emitter is blocked, the selector switch is in the far right position, and a pitch of 8 mm is desired. When both emitters are blocked, a pitch of 4 mm is desired. And when only the left-most emitter is blocked, a pitch of 2 mm is desired. In this manner, the electronic control unit 20 drives the motor 40 to advance carrier tape 30 the desired distance based on input from optical sensor unit 170. Of course, the control unit and pitch selector assembly 110 could be configured to operate at various other pitches without departing from the spirit and scope of this invention. It is also to be understood that a single emitter and multiple sensors or multiple emitters with multiple sensors could be employed instead of a single sensor and multiple emitters as herein described. Furthermore, any known type of sensor can be employed, including the use of mechanical devices such as microswitches or switch 120 can itself be a specialized mechanical switch in which case the sensor would be internal thereto such as is described with reference to FIG. 1.

To provide a visual indication to the operator of the selected pitch, selector pointer 124, which extends through cover plate notch 136, will point to an engraved or marked indication of the selected pitch. For example, a sticker 137 (see FIG. 7) could be applied to cover plate 130 with indicia for indicating the selected pitch. Alternatively, a digital readout display, such as an LED display, (not shown) may be provided to indicate the selected pitch based on input from optical sensor unit 170 or from control unit 20.

The second embodiment of the invention is shown in FIGS. 8–11c. The reference numerals for this and the third embodiment employ the convention of retaining the last two digits for analogous or corresponding parts from the reference numerals employed in the first embodiment. The second embodiment of the invention differs from the first embodiment in two ways. First, the switch, instead of using a lever 122, is provided as a thumb-operated slider 222 which engages the switch 220 through a slot (not visible) in cover plate 230.

Figure 11A:
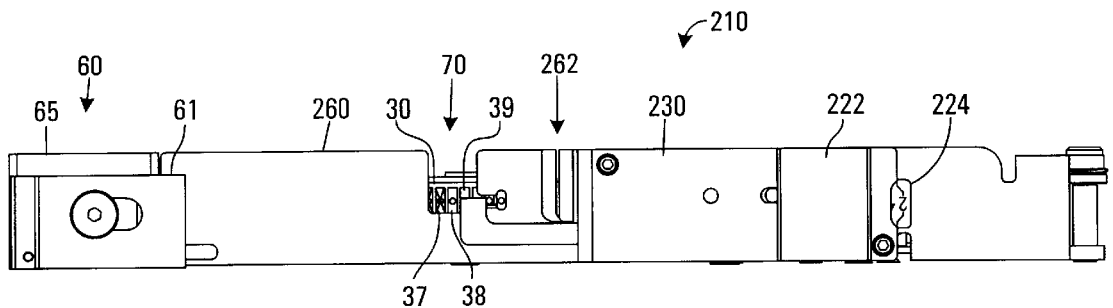
FIGS. 11a, 11b, 11c and 11d show the selector switch in accordance with the second embodiment with the switch in each of three positions and the shutter in its corresponding fully retracted position to show the relation between the shutter and the selector switch.
Figure 11B:
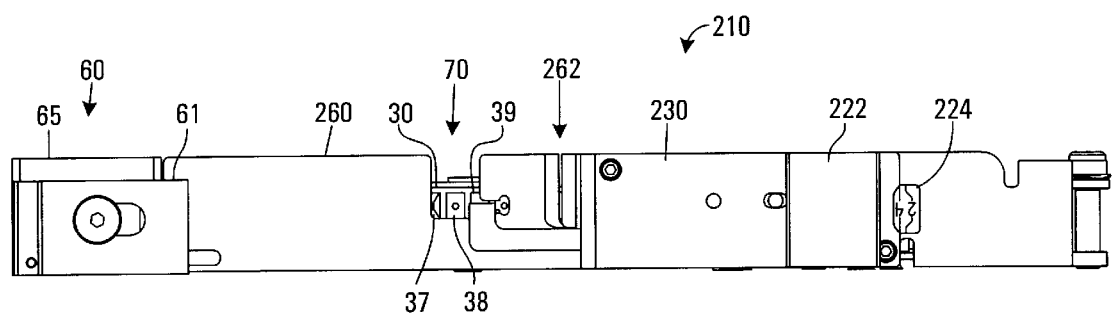
Figure 11C:
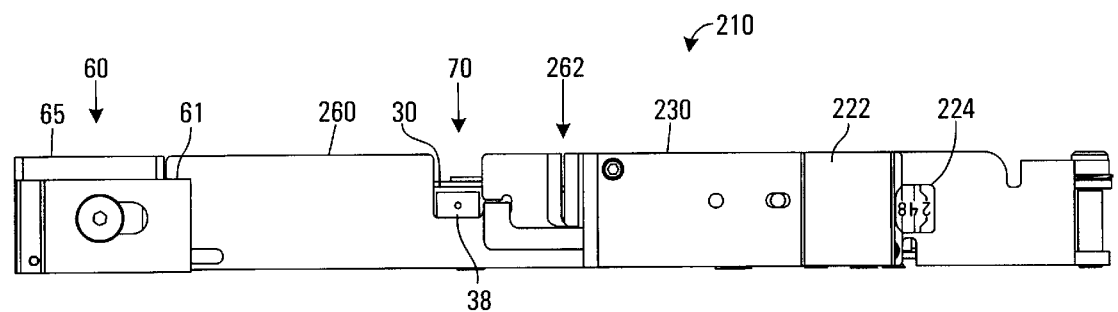

To provide an indication to the operator of the setting, gauge 224, which is formed integrally with switch 220 and provided with indicia, extends from beneath cover plate 230 a distance which varies with the selection of the slider 222 as shown in FIGS. 11a–11c. That is to say, since slider 222 is mechanically linked to switch 220 and gauge 224 is a mere extension and is integrally formed with switch 220, slider 222 moves in unison with gauge 224 and are fixed with respect to one another.

Figure 9:
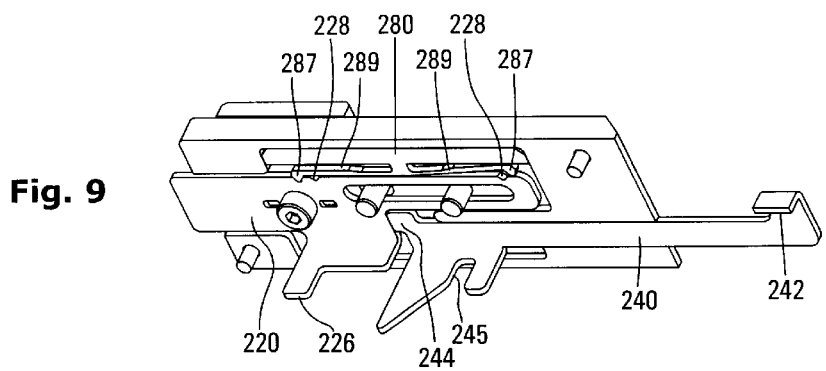
FIG. 9 shows a perspective view of the selector switch mechanism looking up from beneath the mechanism.
Figure 10:
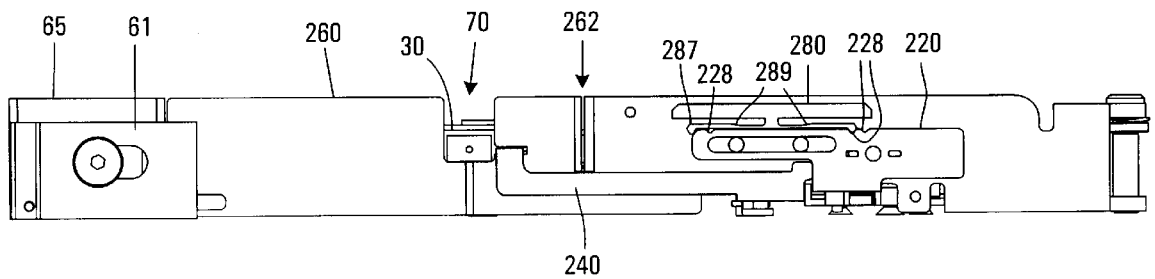
FIG. 10 shows the selector switch mechanism in a top view with the cover plate removed.

Looking to FIGS. 9 and 10, one can see the second major difference between the second embodiment and the first embodiment. That is, spring arms 289 are no longer formed as a part of selector switch 220. This allows spring arms 289 to be formed of a different, more elastic material than that of selector switch 220. This overcomes the problem of having a material which will bend plastically to form a 90° bend so that selector flag 226 can extend vertically downward, and still provide ample elasticity for spring arms 189 as discussed above with respect to the first embodiment and FIGS. 5 and 6. The two spring arms 289 engage three recesses 228 to provide a positive lock at three discreet positions representing a 2 mm pitch tape, a 4 mm pitch tape, and an 8 mm pitch tape, respectively.

In all other respects, the second embodiment operates and functions in a manner similar to the first embodiment.

The effect of the switch's operation on the shutter will now be discussed with reference to the second embodiment, though it applies to all the embodiments. Looking to Figs. 11a–11c, the function of switch 220 of varying the limit on rearward travel of shutter 240 can be seen. In FIG. 11a, switch 220 is set to a 2 mm pitch as indicated by gauge 224. This selection provides for the smallest parts which are placed every 2 mm along the length of carrier tape 30. The pick point is always at the same place regardless of the pitch. Part 37 has already been picked, which is indicated schematically with an "X" across its position in FIG. 11a. Next part 38 is in the pick position and ready to be picked. Note that, were it not for shutter 240, part 39, the part immediately subsequent to next part 38, would be exposed and may fall out due to ambient or other vibrations. Looking to FIG. 11b, we see that for larger parts, the shutter must be permitted to travel further back to provide clearance for the removal of next part 38. Similarly, in FIG. 11c, the shutter is permitted to fully retract when the slider 222 is selected at 8 mm.

Figure 11D:
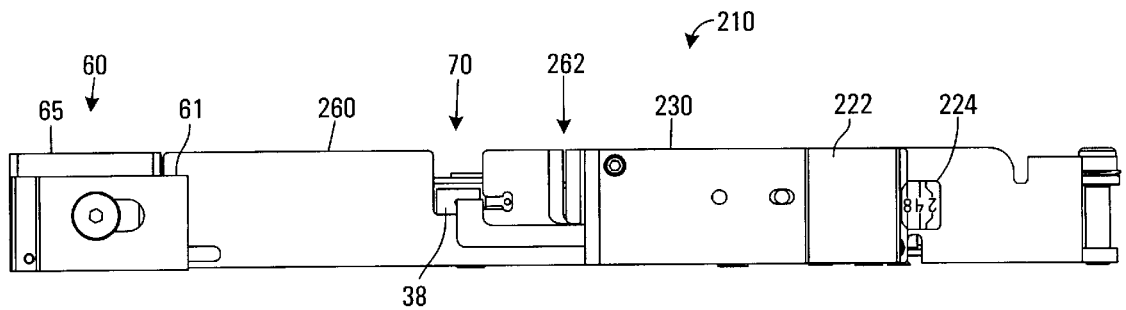

In each case, during the advance operation of carrier tape 30, the shutter travels forward past the pick point as seen in FIG. 11d to ensure that the next part will not fall out of its respective recess. After completion of the advancing process, shutter 240 retracts as far as it is permitted by switch 220.

Figure 12:
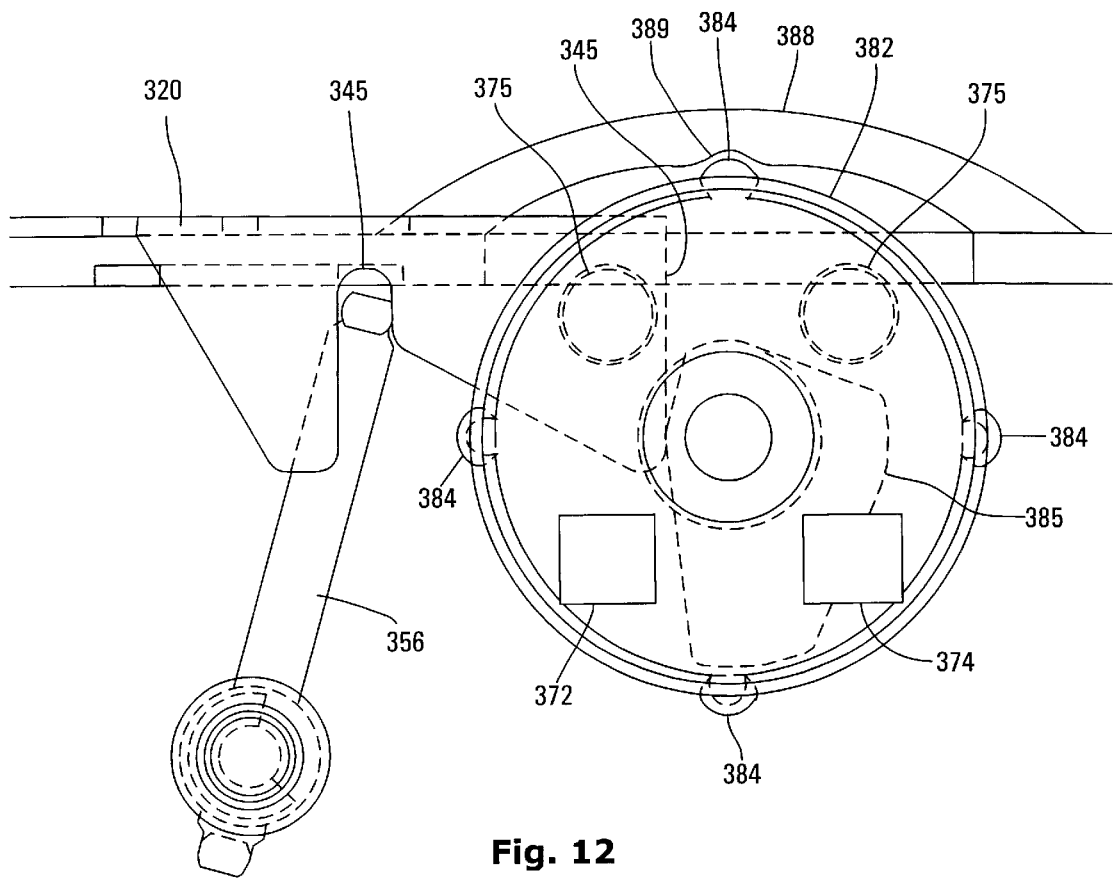
FIG. 12 shows a third embodiment including a rotary switch with cam for stopping the rearward travel of the shutter.

A third embodiment, shown in FIG. 12, employs a rotary switch rather than a slide switch, but functions in a manner similar to that of the previously-discussed embodiment. Instead of boss 144, this embodiment provides an extended surface 344 which comes into contact with cam surface 385 when shutter 320 is at its rear-most permitted position. Wheel 380 is rotated using surface 382, which may be marked with indicia bearing the selected pitch, e.g., 2 mm, 4 mm, 8 mm, and 12 mm. Nubs 384 engage with recess 389 formed into spring 388 when the wheel 380 is at its correct position for the desired pitch. Magnetic Hall-effect sensors 372 and 374 detect magnets 375, but in other respects operate substantially the same as optical sensor unit 170 discussed in the previous embodiment.

Limiting rearward travel of the shutter in each embodiment prevents the escape of parts from their recesses, but also reduces the time required for the advancing operation since there is less distance to travel. Additionally, significant energy savings are manifested due to the both the reduced travel time and the reduced travel distance required for solenoid rod 152.

Other benefits and advantages of the present design will occur to those skilled in the art. In addition, the present invention, as described with reference to the several embodiments, may be modified, adapted and altered without departing from the scope of the invention as defined by the claims appended hereto.

We claim:

1. A pitch switch assembly for a variable pitch carrier tape feeder of the type that periodically advances the carrier tape to sequentially position at a pick-up location each of a series of parts contained in regularly-spaced recesses in a carrier tape, comprising:

a cover assembly for covering a carrier tape having an opening at the pickup location to provide access to a part contained by said carrier tape by a pick and place machine;

a shutter slidably supported by said cover assembly and variably occluding said opening; and a switch accessible and repositionable by an operator to select a desired pitch, the switch comprising:

control means for defining a retracted position of said shutter which varies with the desired pitch, said shutter being in said retracted position when positioned over at least one adjacent part which immediately follows a part positioned at the pickup location without hindering access to the part at the pickup location, and means for providing an indication to a control unit of a desired pitch so that said control unit can advance the carrier tape the correct distance during each advance operation performed by the carrier tape feeder.

2. A pitch switch assembly according to claim 1 further comprising an actuator for advancing the shutter forward to at least partially cover said carrier tape at said pickup location while said carrier tape is being advanced by said carrier tape feeder, said shutter returning back to the retracted position at the completion of the advancing operation.

3. A pitch switch assembly as set forth in claim 2 wherein said control means comprises a stop surface which limits the rearward travel of said shutter as it returns to its retracted position.

4. A pitch switch assembly as set forth in claim 3 wherein said switch is supported adjacent to said shutter in a manner that permits it to slide in only in the direction of movement of said shutter, said stop surface formed into said switch generally transverse to said direction.

5. A pitch switch assembly according to claim 4 wherein said switch can be positioned in one of a plurality of predetermined positions by said operator, said switch including means for locking said switch in any of said predetermined positions requiring increased force to remove said switch from said any of said predetermined positions, said increased force being greater than that exerted by said shutter against said stop surface when said shutter is in said retracted position, said locking means comprising at least one spring-biased nub which slides across and with respect to a surface which includes at least one recess which cooperates with said nub, said switch is locked in said predetermined position when at lease one of said at least one spring-biased nub is aligned with at least one of said at least one recess.

6. A pitch switch assembly as set forth in claim 4 wherein said switch includes a pitch selector flag and a sensing means for detecting the position of the pitch selector flag, said sensing means providing input to said control unit of pitch selected by said switch.

7. A pitch switch assembly according to claim 6 wherein said sensing means comprises a device producing an electrical signal which varies with the position of the switch.

8. A pitch switch assembly as set forth in claim 3 wherein said switch is rotatably supported and said control means comprises a rotating cam mechanically linked to said switch, said stop surface comprising said rotating cam.

9. A pitch switch assembly according to claim 8 wherein said means for providing an indication of a desired pitch comprises at least one magnet whose position is determined by said position of said switch and at least one stationary magnetic Hall-effect sensor.

10. A method of configuring a variable pitch carrier tape feeder of the type that sequentially positions at a pick-up location each of a series of parts contained in regularly spaced recesses in a carrier tape to deliver a carrier tape at a desired pitch, comprising:

covering a carrier tape along a length of a carrier tape from a point adjacent to that which a cover strip is removed from the carrier tape to an opening at said pick-up location;

slidably supporting a shutter to variably and partially occlude said opening;

mechanically controlling the shutter so that, when the carrier tape is not being advanced, it is positioned at a retracted position which varies with desired pitch, the shutter being in a retracted position when positioned over at least one adjacent part which immediately follows a part positioned at the pickup location without hindering access to the part at the pickup location; and providing an indication to an electronic control unit of the desired pitch so that said control unit can advance the carrier tape the correct distance during each advance operation performed by the carrier tape feeder;

said step of mechanically controlling the shutter and the step of providing an indication are both performed by positioning a pitch switch to the desired pitch.

11. The method according to claim 10 further comprising the step of advancing the shutter forward to at least partially cover the carrier tape at said pick-up location while said carrier tape is being advanced by said carrier tape feeder, and returning said shutter to the retracted position at the completion of the advancing operation.

12. The method according to claim 10 wherein said step of mechanically controlling the shutter includes limiting the rearward travel of the shutter as it returns to its retracted position with a stop surface associated with said pitch switch.

13. The method according to claim 12 wherein said step of positioning said switch includes the step of sliding it to any one of several predetermined positions.

14. The method according to claim 12 wherein said step of positioning said switch includes the step of rotating it to any one of several predetermined positions.

15. A variable pitch tape feeder, comprising a carrier tape reel support for supporting carrier tape having any one of several predetermined pitches;

a carrier tape guide for guiding said carrier tape from said reel to a cover strip removal location then a pick-up location;

a feed sprocket for engaging feed-holes regularly spaced along the length of carrier tape for advancing said carrier tape through said tape guide;

a motor for driving said feed sprocket;

a control unit for controlling said motor;

a cover assembly covering said carrier tape from said cover strip removal location to a location past said pick-up location, said cover assembly having an opening at said pickup location;

a shutter slidably mounted to said cover assembly at least partially occluding said opening when positioned in a forward position;

a pitch switch repositionable by an operator having several positions corresponding to said several predetermined pitches, a stop surface limiting rearward travel of said shutter, said stop surface defining a retracted position of said shutter which varies with the position of the pitch switch; and a sensor detecting the position of the pitch switch and providing a pitch input signal to said control unit, said control unit advancing the carrier tape a distance according to said pitch input.

16. A variable pitch tape feeder in accordance with claim 15 further comprising an actuator responsive to said control unit linked with said shutter, said control unit operating said actuator to cause said shutter to move forward while advancing the carrier tape to at least partially cover said pick-up location and cause said shutter to move shutter to said retracted position at completion of said advancing.

17. A variable pitch tape feeder in accordance with claim 15, wherein said pitch switch slides in the direction of said shutter and said pitch switch and said shutter making contact along a plane generally transverse to said direction when said shutter is in said retracted position.

18. A variable pitch tape feeder in accordance with claim 17, wherein said sensor comprises at least one electro-optical light emitter and at least one electro-optical light sensor, and said pitch switch has a pitch selector flag extending between at least one of said at least one said emitter and at least one of said at least one sensor when said switch is positioned in at least one of said several positions.

19. A variable pitch tape feeder in accordance with claim 15, wherein said pitch switch controls a cam which rotates about an axis generally transverse the direction of said shutter, said stop surface comprising said rotating cam.

* * * * *